US012677452B2

(12) United States Patent
Min et al.

(10) Patent No.: US 12,677,452 B2
(45) Date of Patent: Jul. 7, 2026

(54) SEMICONDUCTOR DEVICE HAVING TRENCHES DEFINING TWO-DIMENSIONALLY ARRANGED PROTRUSIONS AND GATE PATTERN SIDEWALLS ALIGNED WITH TRENCH INNER WALLS

(71) Applicant: Samsung Electronics Co., Ltd., Suwon-si (KR)

(72) Inventors: Juseong Min, Suwon-si (KR); Kyeonghoon Park, Suwon-si (KR); Jae-Bok Baek, Suwon-si (KR); Donghyuck Jang, Suwon-si (KR); Jeehoon Han, Suwon-si (KR); Taeyoon Hong, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 575 days.

(21) Appl. No.: 18/303,205

(22) Filed: Apr. 19, 2023

(65) Prior Publication Data

US 2024/0113160 A1 Apr. 4, 2024

(30) Foreign Application Priority Data

Sep. 30, 2022 (KR) ........................ 10-2022-0125599

(51) Int. Cl.
*H10W 10/00* (2026.01)
*H10D 62/10* (2025.01)
(Continued)

(52) U.S. Cl.
CPC ......... *H10D 62/116* (2025.01); *H10D 64/513* (2025.01); *H10W 10/014* (2026.01); *H10W 10/17* (2026.01)

(58) Field of Classification Search
CPC .............. H10D 62/115; H10D 62/116; H10D 84/0151; H10D 84/0153; H10D 84/0188;
(Continued)

(56) References Cited

U.S. PATENT DOCUMENTS 7,151,022 B2 12/2006 Kim
7,807,577 B2 10/2010 Dong et al.
(Continued)

FOREIGN PATENT DOCUMENTS

KR 10-0510379 B1 8/2005

*Primary Examiner* — Younes Boulghassoul
(74) *Attorney, Agent, or Firm* — HARNESS, DICKEY & PIERCE, P.L.C.

(57) ABSTRACT
A semiconductor device include a substrate including a plurality of protrusions protruding from an upper surface thereof and arranged two-dimensionally in a first direction and a second direction intersecting each other, a first trench provided between the protrusions in the first direction, and a second trench provided between the protrusions in the second direction, a first device isolation layer filling the first trench, gate patterns disposed on the protrusions in the second direction, upper surfaces of the protrusions exposed at both sides of the gate patterns, respectively, and a second device isolation layer filling a space between the gate patterns in the second direction and the second trench, and each of the gate patterns has a first sidewall adjacent to the second trench and aligned with an inner wall of the second trench.

20 Claims, 19 Drawing Sheets

(51) Int. Cl.
    *H10D 64/27*        (2025.01)
    *H10W 10/17*        (2026.01)

(58) Field of Classification Search
    CPC ........... H10D 30/0243; H10D 84/0126; H10D
        30/0411; H10D 30/0413; H10D 30/69;
        H10D 30/694; H10D 30/68; H10D
        30/6891; H01L 21/76224; H01L
        21/76229; H01L 21/76232; H10B 41/10;
        H10B 43/10; H10B 41/30; H10B 43/30;
        H10W 10/014; H10W 10/0143; H10W
        10/0145; H10W 10/17
    See application file for complete search history.

(56)          References Cited

U.S. PATENT DOCUMENTS

| 7,989,854 B2 * | 8/2011 | Oh | H10D 30/0413 |
| | | | 257/E21.415 |
| 8,058,168 B2 | 11/2011 | Park et al. | |
| 8,294,198 B2 * | 10/2012 | Yoo | H10D 30/69 |
| | | | 257/314 |
| 8,343,846 B2 | 1/2013 | Dong | |
| 8,697,339 B2 | 4/2014 | Zhuang et al. | |
| 8,963,220 B2 | 2/2015 | Grossi et al. | |
| 9,437,470 B2 | 9/2016 | Lu et al. | |
| 10,431,308 B1 | 10/2019 | Wang | |
| 10,804,160 B2 | 10/2020 | Jeon et al. | |
| 2005/0136601 A1 * | 6/2005 | Jang | H10B 69/00 |
| | | | 438/296 |
| 2010/0047994 A1 * | 2/2010 | Dong | H10W 10/014 |
| | | | 257/E21.573 |
| 2012/0012946 A1 * | 1/2012 | Yugami | H10D 62/116 |
| | | | 257/411 |
| 2014/0312408 A1 * | 10/2014 | Fang | H01L 21/76224 |
| | | | 438/424 |
| 2015/0214235 A1 * | 7/2015 | Lee | H10B 41/30 |
| | | | 438/266 |
| 2016/0126250 A1 * | 5/2016 | Chang | H10D 64/037 |
| | | | 438/287 |
| 2019/0363095 A1 * | 11/2019 | Omizu | H10B 43/10 |
| 2022/0059558 A1 * | 2/2022 | Kim | H10B 41/27 |
| 2022/0149060 A1 * | 5/2022 | Sim | H10B 41/41 |
| 2023/0111003 A1 * | 4/2023 | Fujita | H10D 84/83 |
| | | | 257/384 |

* cited by examiner

FIG. 2

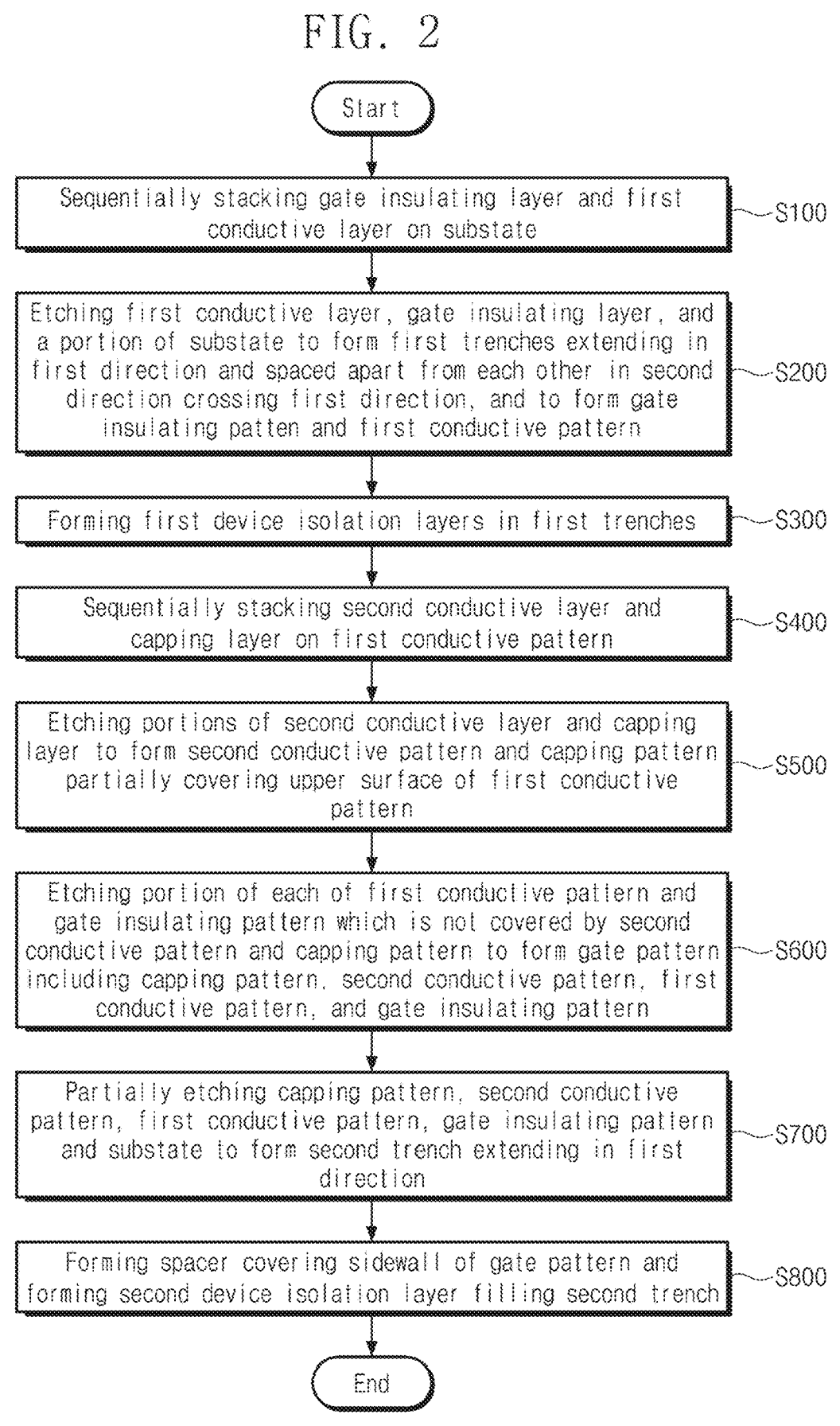

Start

Sequentially stacking gate insulating layer and first conductive layer on substate — S100

Etching first conductive layer, gate insulating layer, and a portion of substate to form first trenches extending in first direction and spaced apart from each other in second direction crossing first direction, and to form gate insulating patten and first conductive pattern — S200

Forming first device isolation layers in first trenches — S300

Sequentially stacking second conductive layer and capping layer on first conductive pattern — S400

Etching portions of second conductive layer and capping layer to form second conductive pattern and capping pattern partially covering upper surface of first conductive pattern — S500

Etching portion of each of first conductive pattern and gate insulating pattern which is not covered by second conductive pattern and capping pattern to form gate pattern including capping pattern, second conductive pattern, first conductive pattern, and gate insulating pattern — S600

Partially etching capping pattern, second conductive pattern, first conductive pattern, gate insulating pattern and substate to form second trench extending in first direction — S700

Forming spacer covering sidewall of gate pattern and forming second device isolation layer filling second trench — S800

End

220

D1

D2

220
210

100

I          I'

D3

D2

120

220   210

110

100

II         II'

D3

D1

240'
230'
220'
210'

100

I        I'

D3
D2

240'
230'
220'
210'        200

120

110
100

II        II'

D3
D1

240'
230'
220'
210'
400
100

I
I'

D3
D2

400
110
100

II
II'

240' 230'   120   220' 210'

D3
D1

SEMICONDUCTOR DEVICE HAVING TRENCHES DEFINING TWO-DIMENSIONALLY ARRANGED PROTRUSIONS AND GATE PATTERN SIDEWALLS ALIGNED WITH TRENCH INNER WALLS

CROSS-REFERENCE TO RELATED APPLICATIONS

This U.S. non-provisional patent application claims priority under 35 U.S.C. § 119 to Korean Patent Application No. 10-2022-0125599, filed on Sep. 30, 2022, in the Korean Intellectual Property Office, the entire contents of which are hereby incorporated by reference.

BACKGROUND

Example embodiments relate to a semiconductor device and/or a method of fabricating the same.

Semiconductor memory devices which are mainly used as storage devices include a volatile memory such as a DRAM and/or an SRAM, and a non-volatile memory such as one or more of an EEPROM, an FRAM, a PRAM, an MRAM, and a flash memory.

Recently, devices using non-volatile memory are increasing. For example, an MP3 player, a digital camera, a mobile phone, a camcorder, a flash cards, and a solid state disk (SSD) use nonvolatile memories as storage devices.

Among the non-volatile memories, a flash memory has a function of electrically erasing data one cell at a time, and is now more widely used as a storage device than a hard drive. Recently, in view of the demand or desire for increased storage capacity, a method of more efficiently using a storage space of the flash memory is desired. Accordingly, instead of utilizing a planar transistor structure, a non-volatile memory device having a vertical transistor structure has been developed.

SUMMARY

Some example embodiments provide a highly integrated semiconductor device with improved electrical characteristics.

However, example embodiments are not limited to the above, and other features not mentioned will be clearly understood by those of ordinary skill in the art from the description below.

A semiconductor device according to various example embodiments includes a substrate including a plurality of protrusions protruding from an upper surface thereof and arranged two-dimensionally in a first direction and a second direction intersecting each other, the substrate having a first trench between the protrusions and arranged in the first direction, and a second trench between the protrusions and arranged in the second direction, a first device isolation layer filling the first trench, gate patterns on the protrusions in the second direction with upper surfaces of the protrusions exposed at both sides of the gate patterns, respectively, and a second device isolation layer filling the second trench and a space between the gate patterns in the second direction. Each of the gate patterns has a first sidewall adjacent to the second trench and aligned with an inner wall of the second trench.

A semiconductor device according to various example embodiments includes a substrate including a plurality of protrusions protruding from an upper surface thereof and arranged two-dimensionally in a first direction and a second direction intersecting each other, the substrate defining a first trench between the protrusions in the first direction, and a second trench between the protrusions in the second direction, a first device isolation layer filling the first trench, gate patterns on the protrusions in the second direction, upper surfaces of the protrusions exposed at both sides of the gate patterns, respectively, each of the gate patterns adjacent to the second trench and having a first sidewall aligned with an inner wall of the second trench, and the gate patterns including second sidewalls spaced apart in the first direction, source/drain regions within the protrusions on both sides of the gate patterns, a second device isolation layer filling the second trench and a space between the gate patterns in the second direction, and a spacer covering the second sidewalls of the gate patterns. The spacer has the same material as a material of the second device isolation layer, and the spacer is connected to the second device isolation layer without an interface between the spacer and the second device isolation layer.

A semiconductor device according to various example embodiments includes a substrate including a plurality of protrusions protruding from an upper surface thereof and arranged two-dimensionally in a first direction and a second direction intersecting each other, the substrate having a first trench between the protrusions in the first direction, and a second trench provided between the protrusions in the second direction, a first device isolation layer filling the first trench, gate patterns on the protrusions in the second direction, upper surfaces of the protrusions exposed at both sides of the gate patterns, respectively, and each of the gate patterns being adjacent to the second trench and having a first sidewall aligned with an inner wall of the second trench, source/drain regions disposed within the protrusions on both sides of the gate patterns, and a second device isolation layer filling the second trench and a space between the gate patterns in the second direction, and a depth of a bottom surface of the first trench from an upper end of the first device isolation layer is different from a depth of a bottom surface of the second trench.

A method of fabricating a semiconductor device according to various example embodiments includes sequentially stacking a gate insulating layer and a first conductive layer on a substrate, etching the first conductive layer, the gate insulating layer, and a portion of the substrate to form first trenches extending in a first direction and spaced apart from each other in a second direction crossing the first direction, and to form a gate insulating pattern and a first conductive pattern, forming first device isolation layers in the first trenches, sequentially stacking a second conductive layer and a capping layer on the first conductive pattern, etching portions of the second conductive layer and the capping layer to form a second conductive pattern and a capping pattern which at least partially cover an upper surface of the first conductive pattern and extend in the second direction, etching a portion of each of the first conductive pattern and the gate insulating pattern which is not covered by the second conductive pattern and the capping pattern to form a gate pattern including the capping pattern, the second conductive pattern, the first conductive pattern, and the gate insulating pattern, partially etching portions of the capping pattern, the second conductive pattern, the first conductive pattern, the gate insulating pattern, and the substrate to form a second trench extending in the first direction, and forming a spacer covering a sidewall of the gate pattern and forming a second device isolation layer filling the second trench.

BRIEF DESCRIPTION OF THE DRAWINGS

Various example embodiments will be more clearly understood from the following brief description taken in conjunction with the accompanying drawings. The accompanying drawings represent non-limiting, example embodiments as described herein.

FIG. 2 is a flowchart illustrating a method of fabricating a semiconductor device according to various example embodiments.

DETAILED DESCRIPTION

Hereinafter, to explain various inventive concepts in more detail, various example embodiments according to inventive concepts will be described in more detail with reference to the accompanying drawings.

Figure 1A:
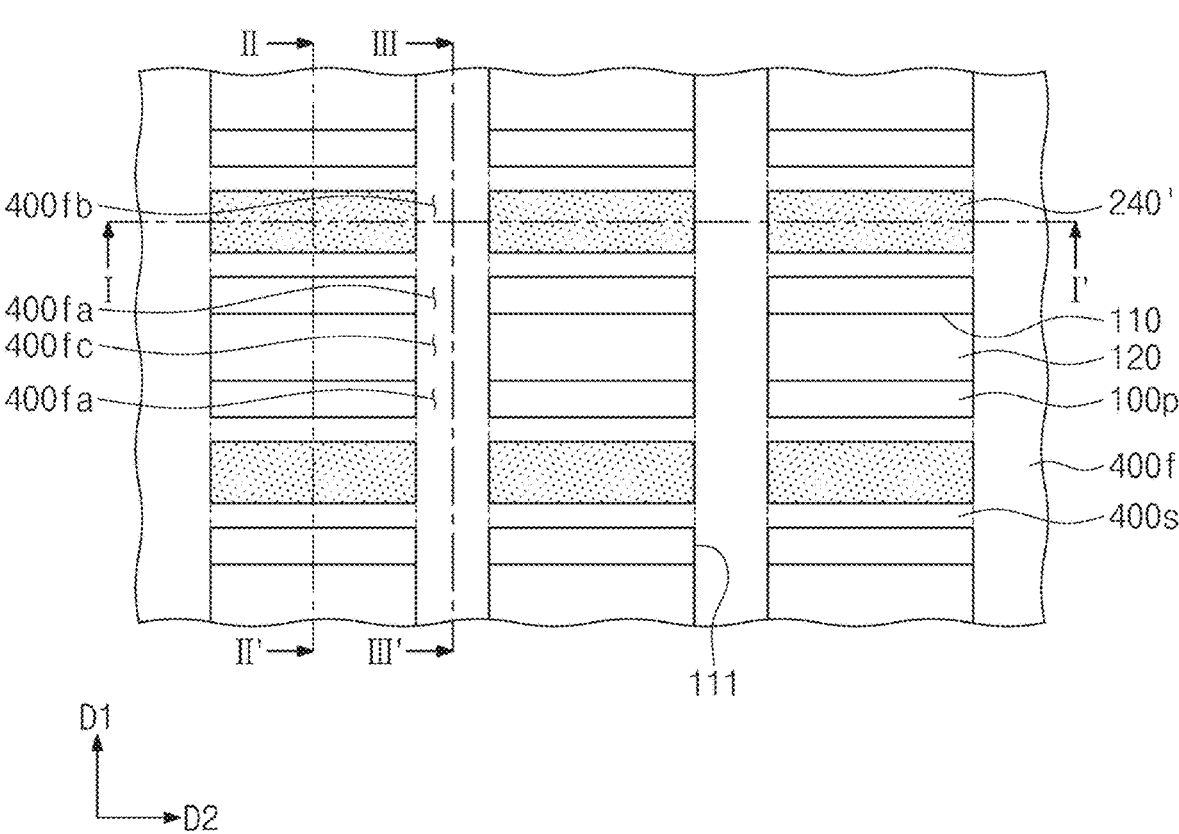
FIG. 1A is a plan view illustrating a semiconductor device according to various example embodiments.
Figure 1B:
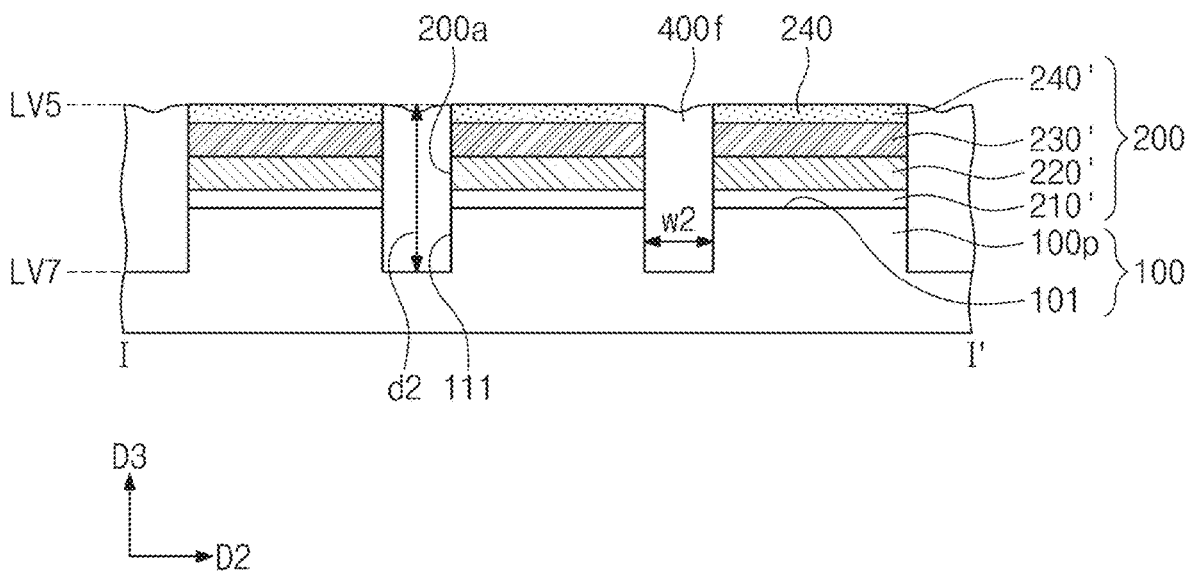
FIG. 1B is a cross-sectional view of the semiconductor device of FIG. 1A taken along line I-I'.
Figure 1C:
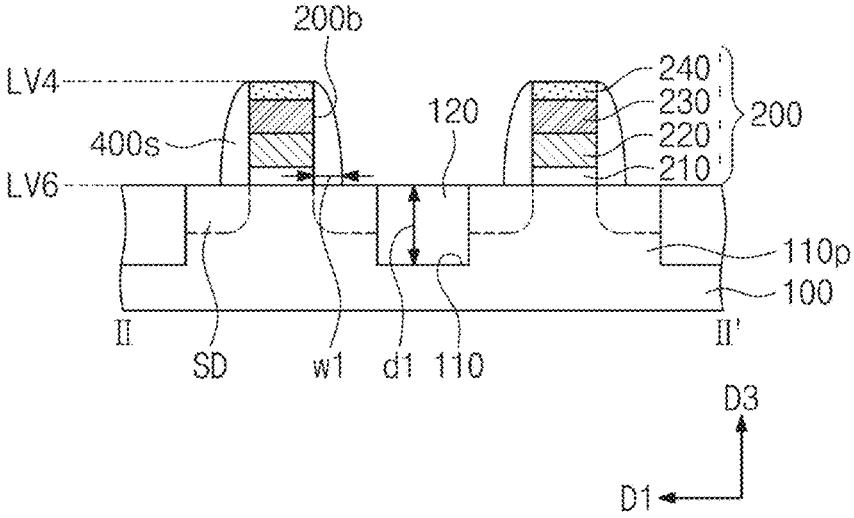
FIG. 1C is a cross-sectional view of the semiconductor device of FIG. 1A taken along line II-II'.
Figure 1D:
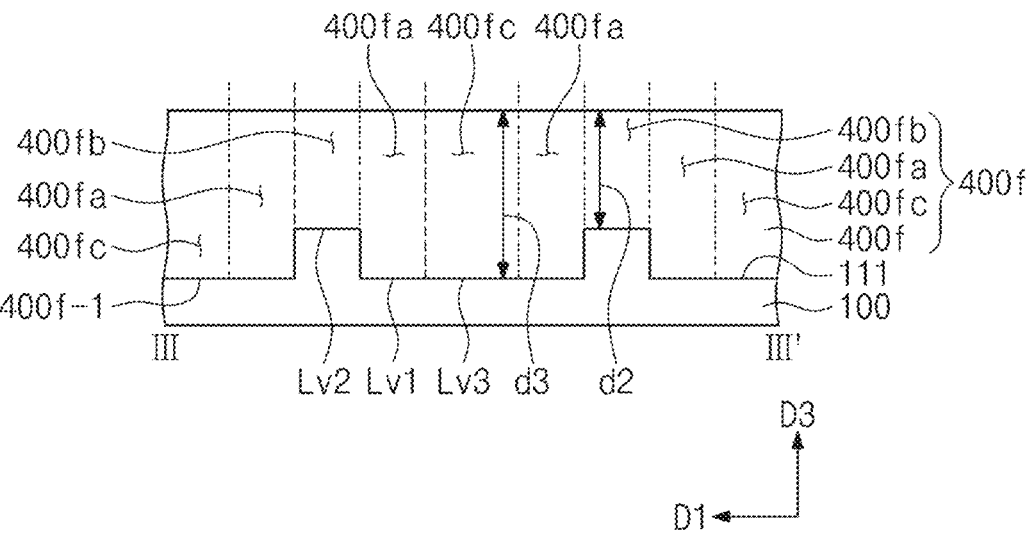
FIG. 1D is a cross-sectional view of the semiconductor device of FIG. 1A taken along line III-III'.
Figure 1E:
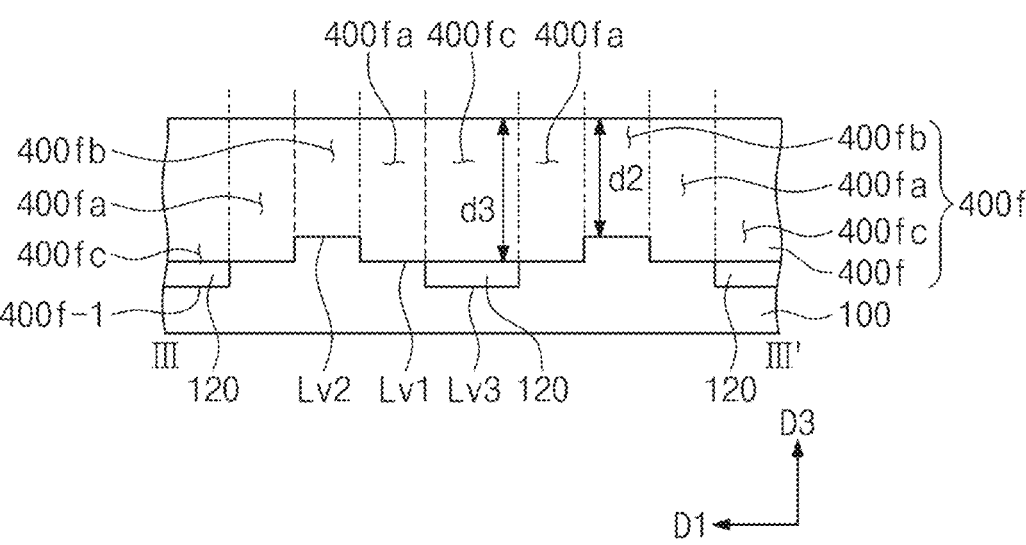
FIG. 1E is a view showing another example of a cross-sectional view of the semiconductor device of FIG. 1A taken along line III-III'.
Figure 3A:
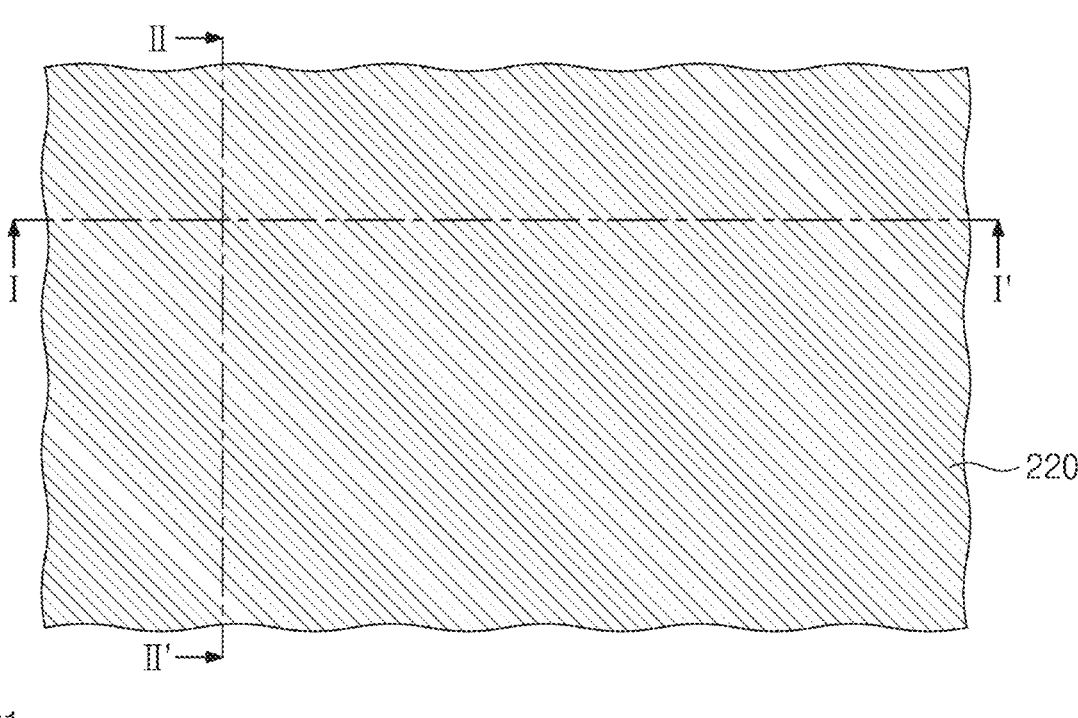
FIGS. 3A, 4A, 5A, 6A, 7A, 8A, and 9A are plan views sequentially illustrating a method of fabricating a semiconductor device having the plan of FIG. 1A.
Figure 3B:
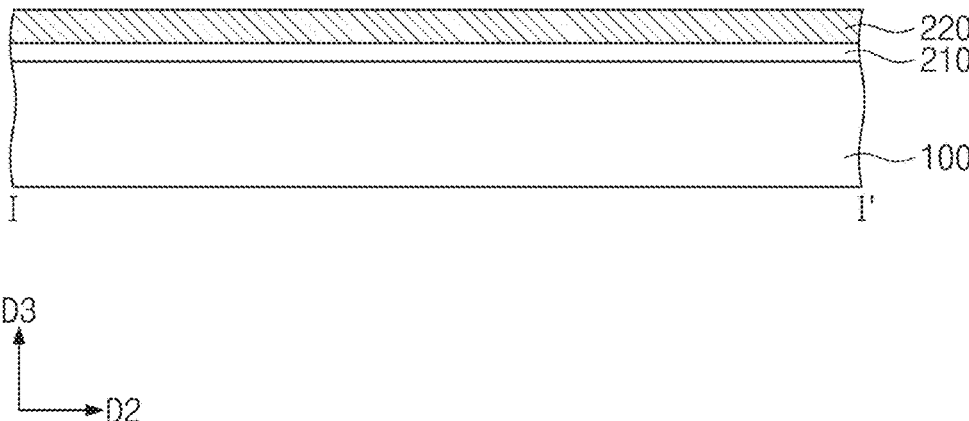
FIGS. 3B, 4B, 5B, 6B, 7B, 8B, and 9B are cross-sectional views sequentially illustrating a method of fabricating a semiconductor device having the cross-section of FIG. 1B.
Figure 3C:
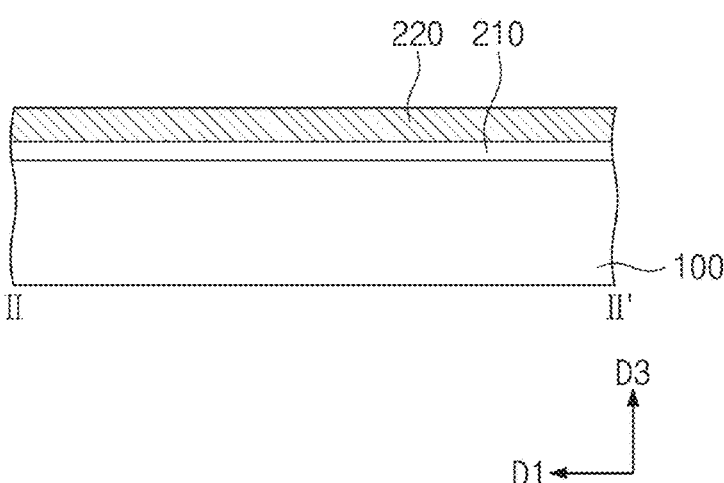
FIGS. 3C, 4C, 5C, 6C, 7C, 8C, and 9C are cross-sectional views sequentially illustrating a method of fabricating a semiconductor device having the cross-section of FIG. 1C.
Figure 4A:
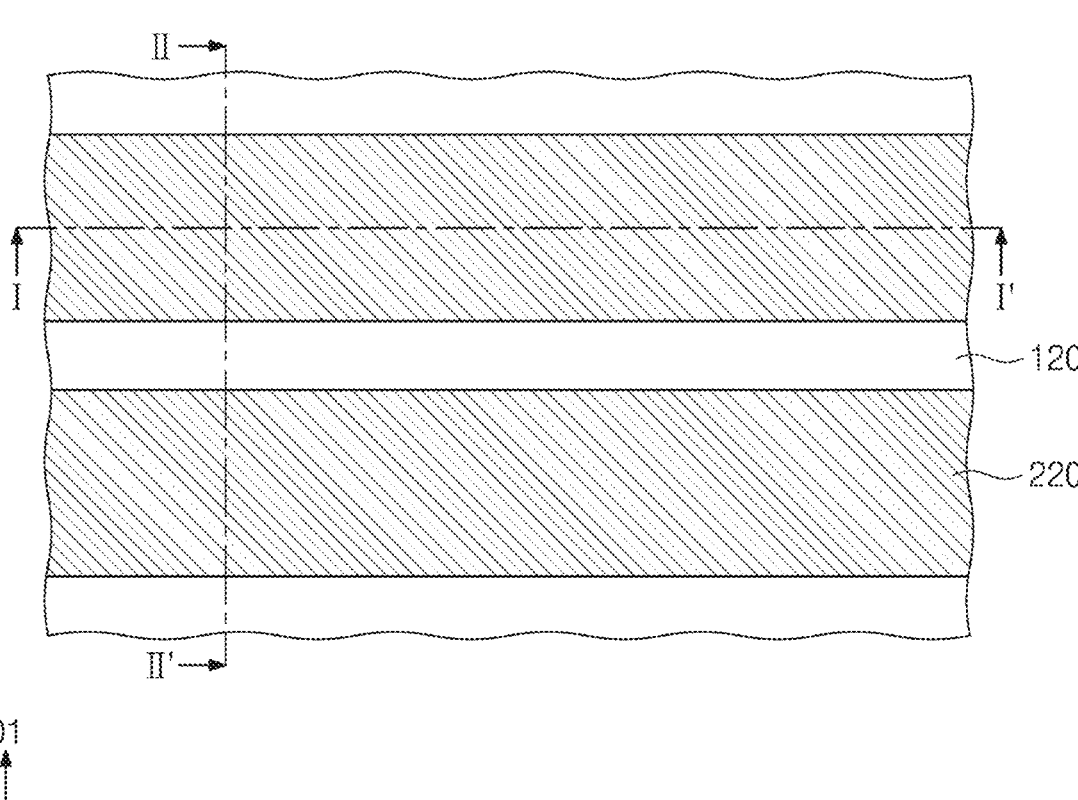
Figure 4B:
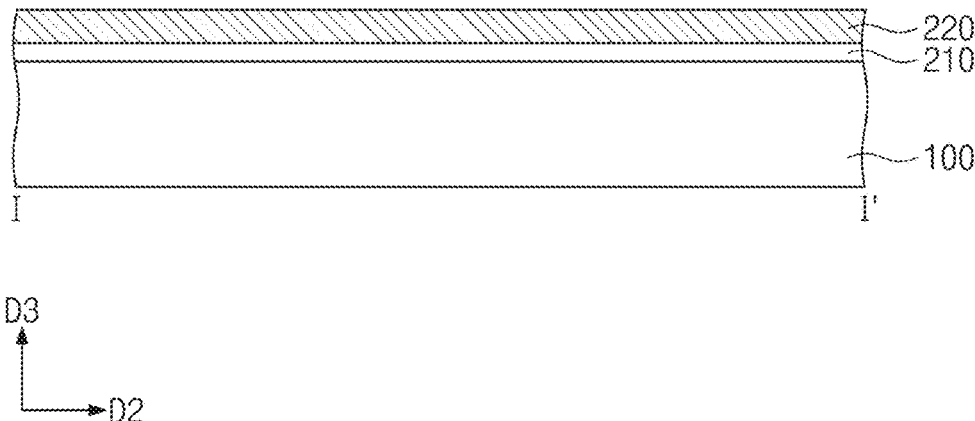
Figure 4C:
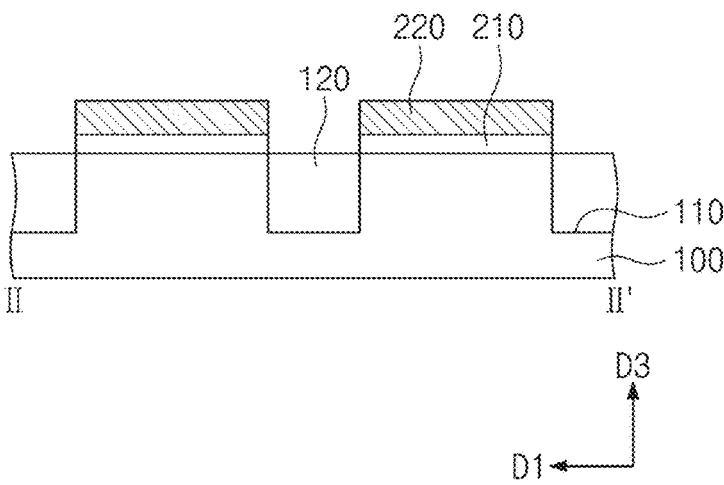
Figure 5A:
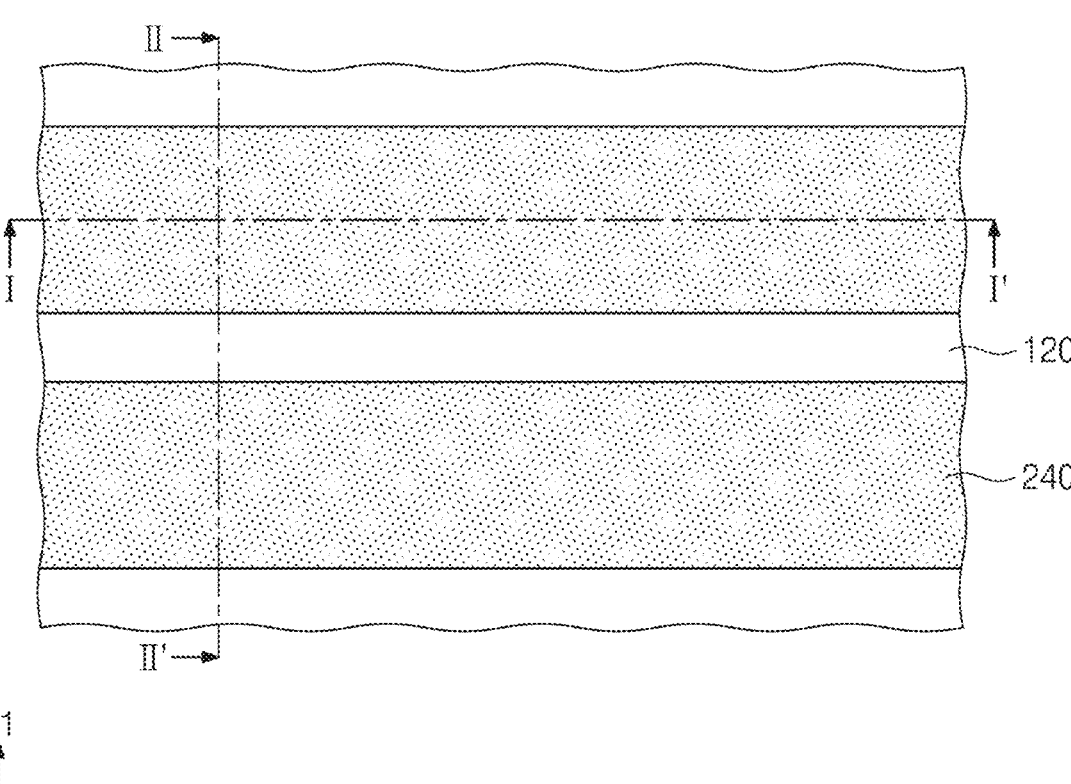
Figure 5B:
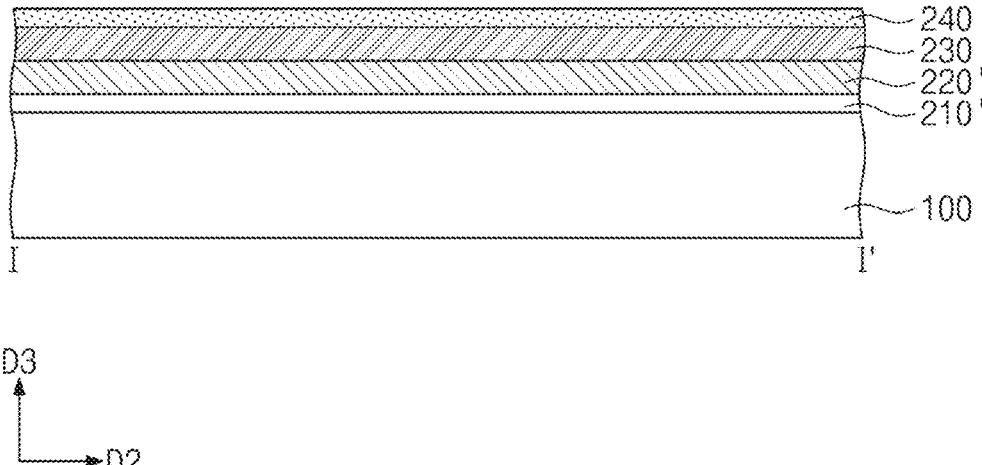
Figure 5C:
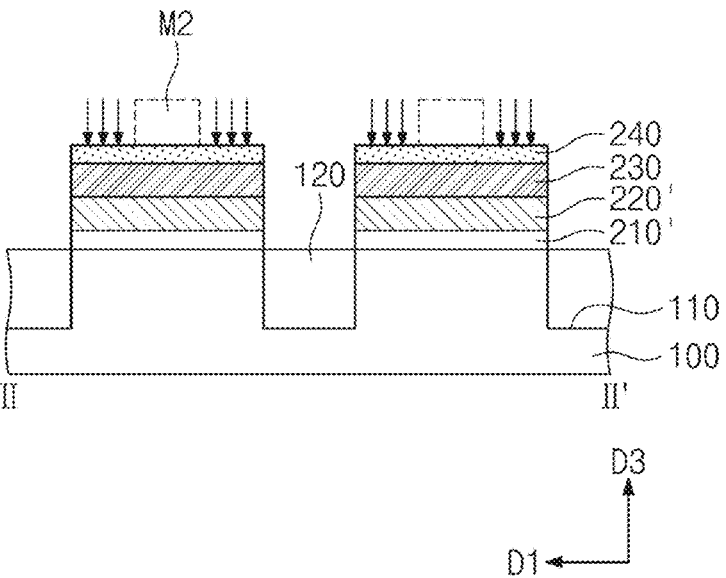
Figure 6A:
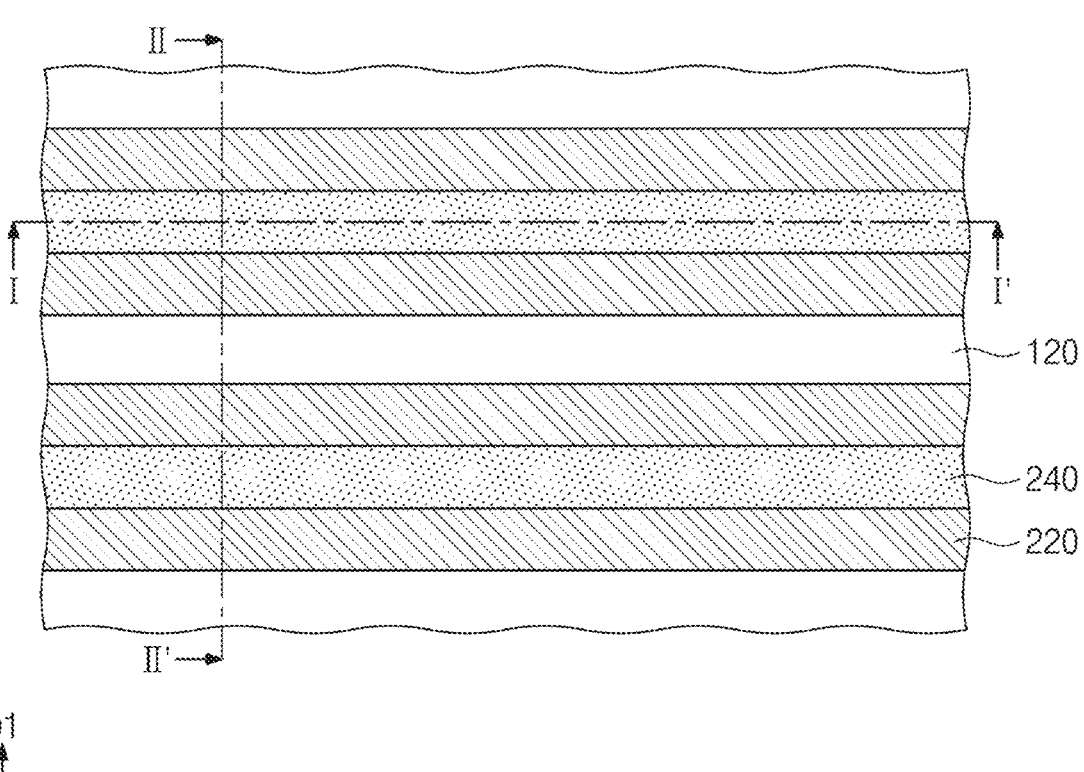
Figure 6B:
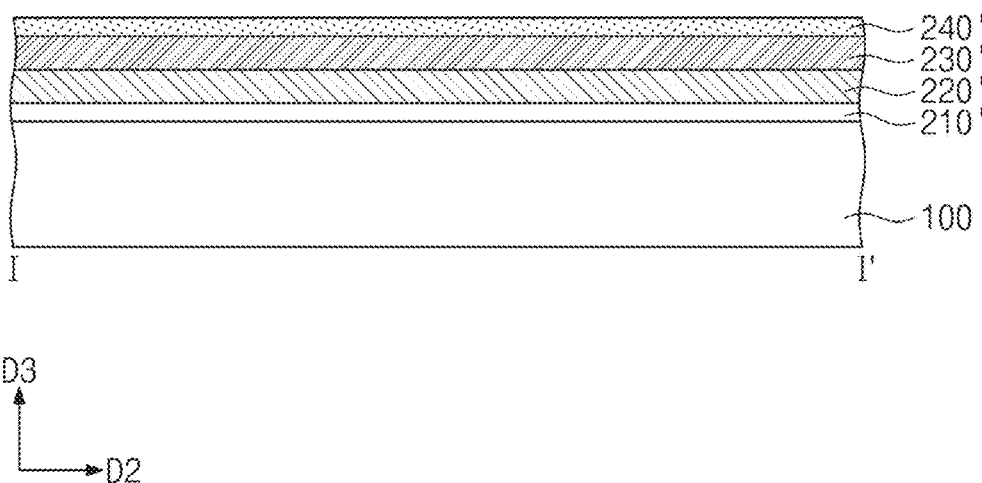
Figure 6C:
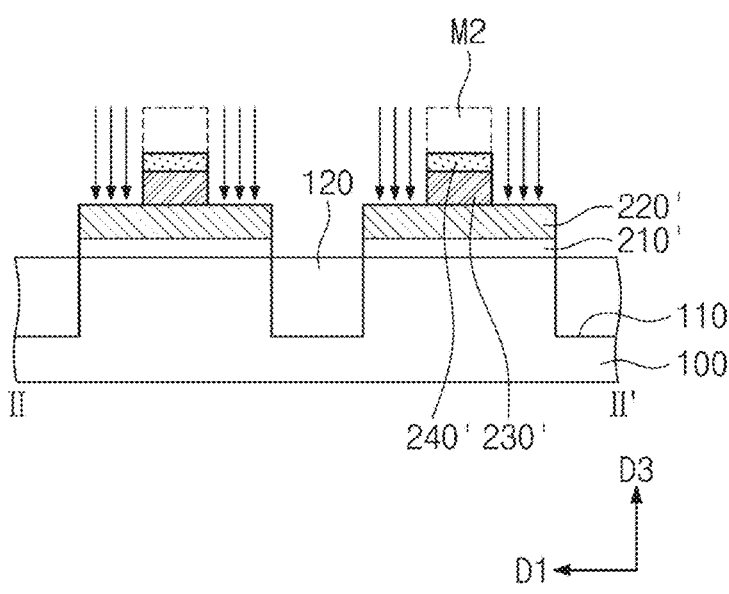
Figure 7A:
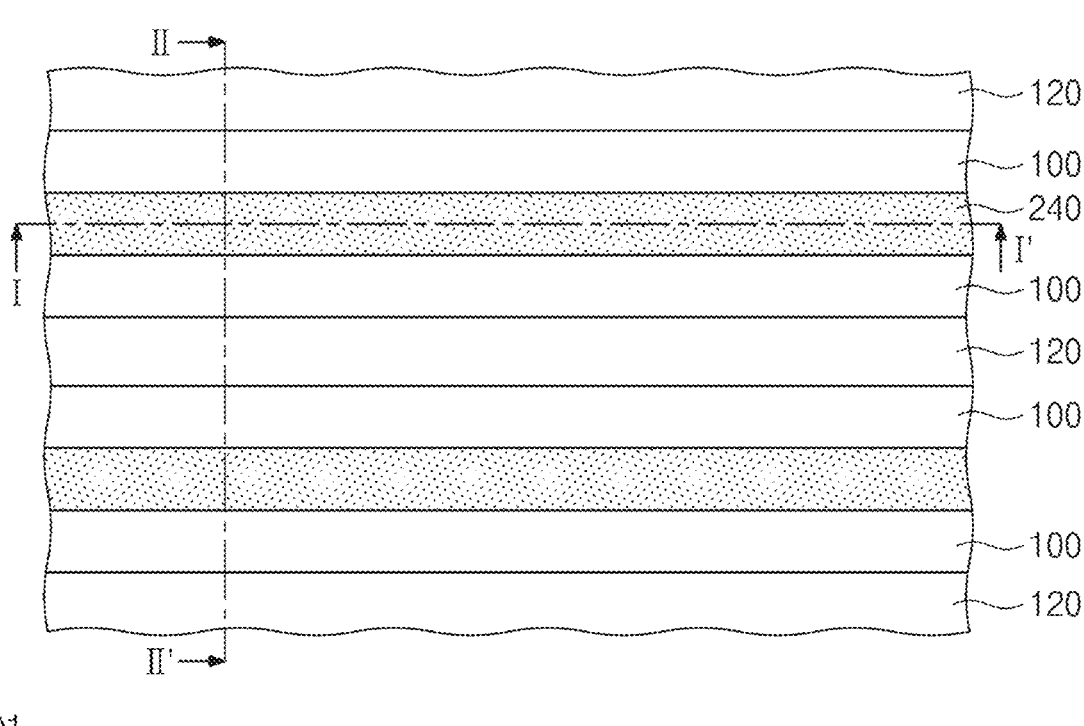
Figure 7B:
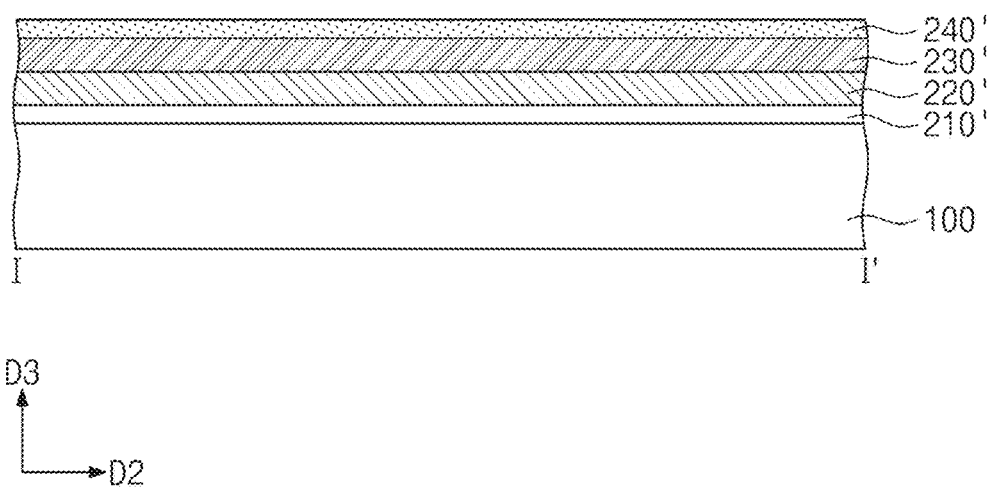
Figure 7C:
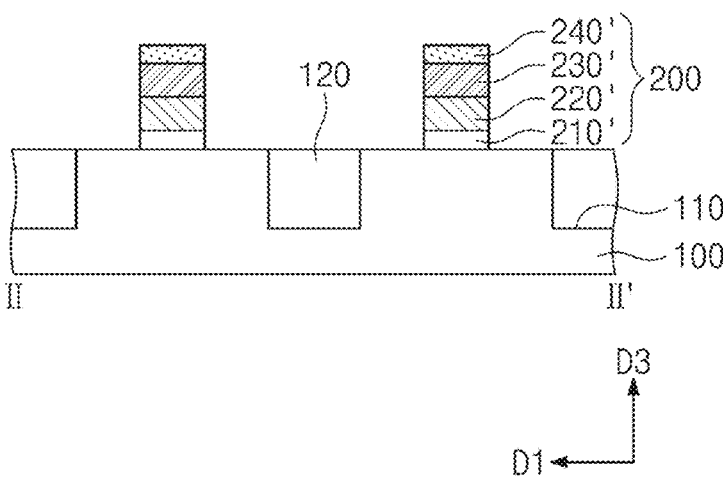

FIG. 1A is a plan view illustrating a semiconductor device according to various example embodiments. FIG. 1B is a cross-sectional view of the semiconductor device of FIG. 1A taken along line I-I'. FIG. 1C is a cross-sectional view of the semiconductor device of FIG. 1A taken along line II-II'. FIG. 1D is a cross-sectional view of the semiconductor device of FIG. 1A taken along line III-III'. FIG. 1E is a view showing another example of a cross-sectional view of the semiconductor device of FIG. 1A taken along line III-III'.

Referring to FIGS. 1A to 1D, a semiconductor device includes a substrate 100, a first trench 110, a second trench 111, a first device isolation layer 120, gate patterns 200, and a second device isolation layer 400f, and a spacer 400s.

The substrate 100 may include a silicon (Si) single crystal; however, example embodiments are not limited thereto. The substrate 100 may be doped or undoped; example embodiments are not limited thereto. The substrate 100 may extend two-dimensionally in parallel in a first direction D1 and a second direction D2 crossing each other.

The substrate 100 includes protrusions 100p. The protrusions 100p may protrude from an upper surface 101 of the substrate 100. The protrusions 100p may be two-dimensionally arranged in the first direction D1 and the second direction D2 crossing each other.

The first trench 110 may be provided in the first direction D1. A plurality of first trenches 110 may be provided and disposed in the first direction D1.

As shown in FIG. 1C, the first device isolation layer 120 may be filled, e.g. may full fill or fully be filled, in the first trench 110. The first trench 110 may have a first depth d1 from a top end of the first device isolation layer 120 to a bottom surface of the first device isolation layer 120.

The first device isolation layer 120 may include, for example, at least one of a silicon nitride layer, a silicon oxide layer, and a silicon oxynitride layer.

The gate patterns 200 may be disposed on the protrusions 100p in the second direction D2. Each of the gate patterns 200 may extend in the second direction D2. Each of the gate patterns 200 may be disposed to be spaced apart from each other in the first and second directions D1 and D2.

Upper surfaces of the protrusions 100p may be exposed on both sides of the gate patterns 200. Source/drain regions SD may be disposed in the protrusions 100p on two, e.g. on both sides of the gate patterns 200.

The second trench 111 may be provided in the second direction D2. A plurality of second trenches 111 may be provided and disposed in the second direction D2.

As shown in FIG. 1B, the second device isolation layer 400f may be filled in or within the second trench 111. The second trench 111 may have a second depth d2 from a top end of the second device isolation layer 400f to a bottom surface of the second device isolation layer 400f. The second device isolation layer 400f may have a planer upper surface or may have a curved upper surface, such as a concave upper surface.

The second device isolation layer 400f may fill the second trench 111. Also, the second device isolation layer 400f may fill or at least partially fill a space between the gate patterns 200 in the second direction D2. The second device isolation layer 400f may include, for example, at least one of a silicon nitride layer, a silicon oxide layer, and a silicon oxynitride layer. The second device isolation layer 400f may be formed of the same material as the spacer 400s described later.

A depth (e.g. first depth, d1) of the bottom surface of the first trench 110 from the top end of the first device isolation layer 120 may be different from a depth (second depth, d2) of the bottom surface of the second trench 111. However, example embodiments are not limited thereto, and the depth (first depth, d1) of the bottom surface of the first trench 110 and the depth (second depth, d2) of the bottom surface of the second trench 111 may be the same as each other.

Each of the gate patterns 200 may be provided adjacent to the second trench 111. Each of the gate patterns 200 may be provided between adjacent second trenches 111. The gate patterns 200 may have first sidewalls 200a aligned with inner walls of the second trenches 111. The first sidewall 200a may be aligned with or flushed with an outer wall of the protrusion 100p of the substrate 100.

Additionally, as shown in FIG. 1C, each of the gate patterns 200 may have second sidewalls 200b spaced apart by a certain distance in the first direction D1. The second sidewalls 200b may form both sidewalls of the gate pattern 200.

The spacer 400s may cover the second sidewalls 200b of the gate patterns 200.

The spacer 400s may be formed of or include an insulating material. The spacer 400s may have the same material as a material of the second device isolation layer 400f. The spacer 400s may include at least one of a silicon nitride layer, a silicon oxide layer, and a silicon oxynitride layer.

Referring to FIG. 1A, the spacer 400s may extend in the second direction D2 and integrally connect with the second device isolation layer 400f. In this case, as the spacer 400s and the second device isolation layer 400f may be simultaneously formed of the same material, and accordingly there may be no interface between the spacer 400s and the second device isolation layer 400f. As will be described later, in a process of fabricating a semiconductor device, an insulating material may be applied on an upper portion of the substrate 100 and the gate pattern 200 and may fill the second trench 111 to form the second device isolation layer 400f, and may cover the gate pattern 200 provided on an upper surface of the protrusion 100p, and thus the spacer 400s and the second device isolation layer 400f may be formed of the same material.

An upper level LV4 of the spacer 400s is the same as an upper level LV5 of the second device isolation layer 400f. A lower level LV6 of the spacer 400s may be positioned at a level higher than a lower level LV7 of the second device isolation layer 400f.

The spacer 400s may have a first width w1 in the first direction D1 as shown in FIG. 1C, and the second device isolation layer 400f may have a second width w2 greater than the first width w1 in the second direction D2 as shown in FIG. 1B. The second width w2 may be smaller than twice the first width w1.

Referring back to FIG. 1A, the second device isolation layer 400f may extend in the first direction D1. Referring to FIG. 1D, a lower surface 400f-1 of the second device isolation layer 400f may have a concavo-convex structure.

In detail, referring to FIGS. 1A and 1D, the second device isolation layer 400f may include a first portion 400fa between the protrusions 100p, a second portion 400fb between the gate patterns 200, and a third portion 400fc between the first device isolation layers 120.

A level LV2 of a lower surface of the second portion 400fb may be higher than levels LV1 and LV3 of the first portion 400fa and the third portion 400fc. Alternatively or additionally, the levels LV1 and LV3 of the first portion 400fa and the third portion 400fc may be equal to each other.

Figure 8A:
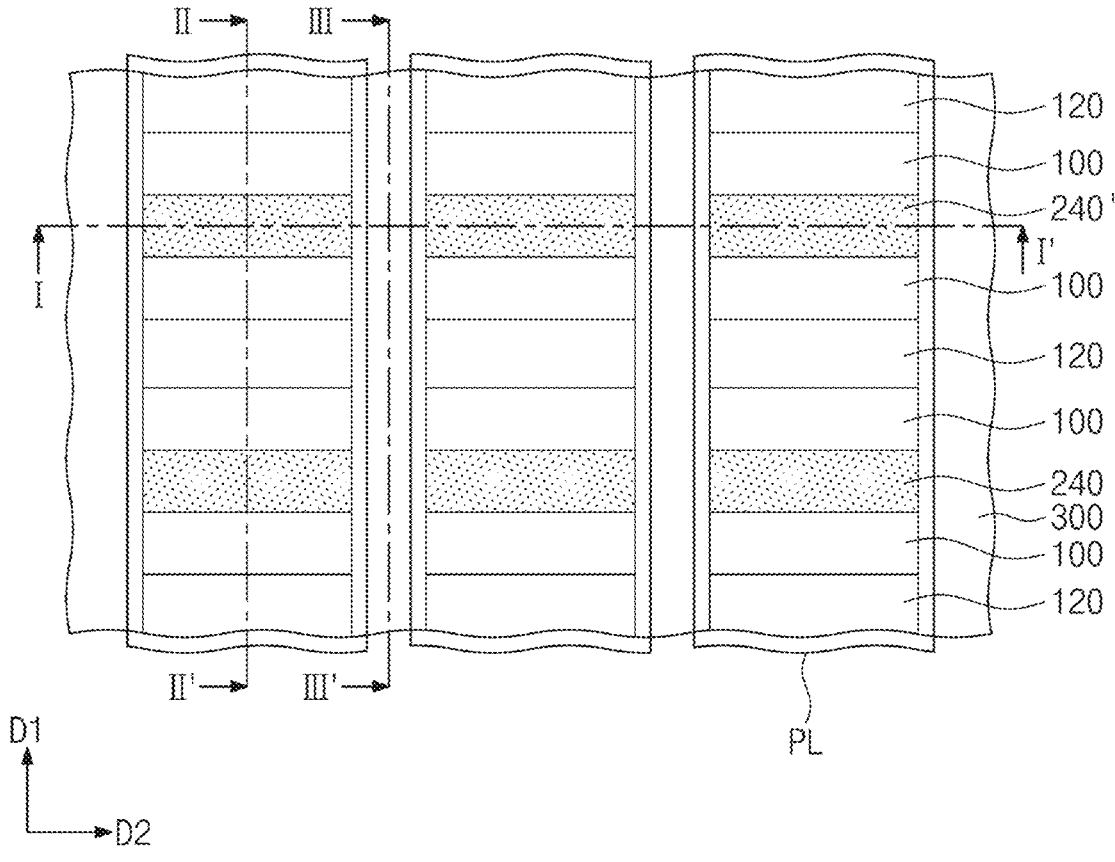
Figure 8B:
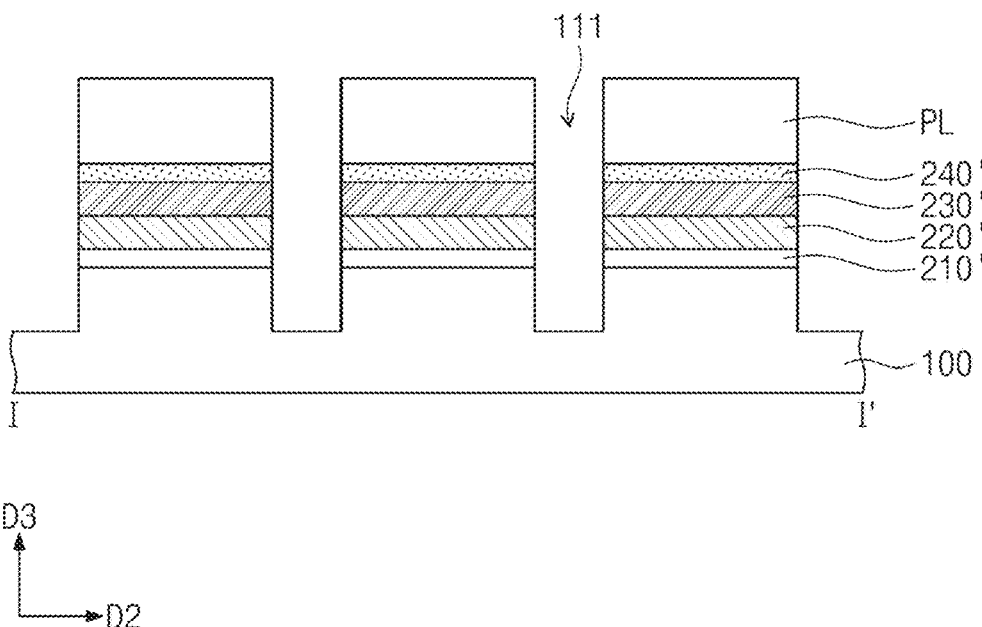
Figure 8C:
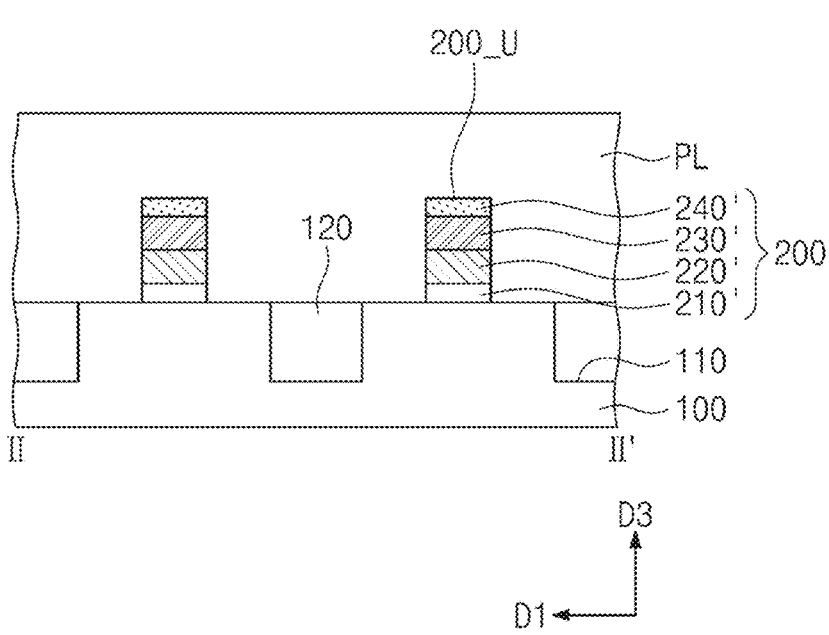
Figure 8D:
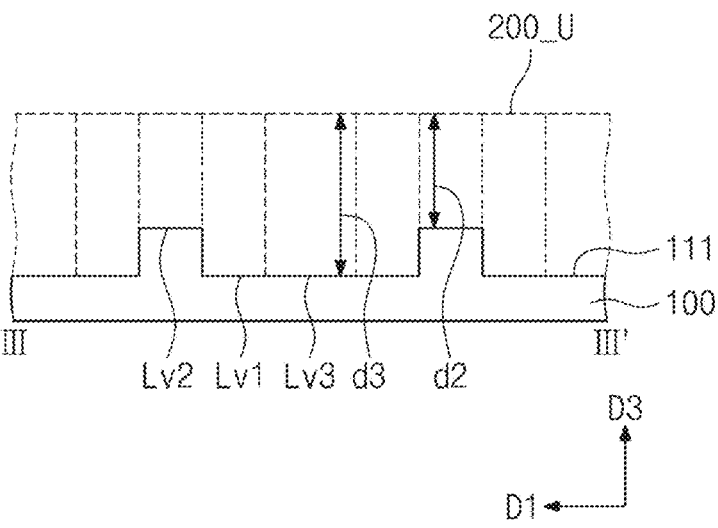
FIG. 8D is a cross-sectional view taken along line III-III' of FIG. 8A.
Figure 8E:
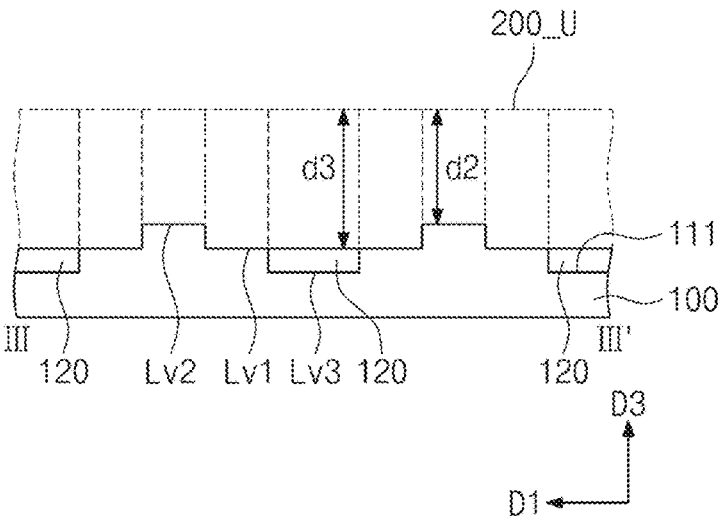
FIG. 8E is a view illustrating another example of a cross-sectional view taken along line III-III' of FIG. 8A.

Meanwhile, in a process of etching the substrate 100 and the first device isolation layer 120 to form the second trench 111 during the manufacturing process of the semiconductor device (refer to FIG. 8D), the first device isolation layer 120 as shown in FIG. 8E may not be completely etched but may remain or at least partially remain. The second device isolation layer 400f may be filled in the second trench 111 formed by etching as shown in FIG. 1E.

Hereinafter, a method of fabricating a semiconductor device described above with reference to FIGS. 1A to 1D will be described.

FIGS. 3A, 4A, 5A, 6A, 7A, 8A, and 9A are plan views sequentially illustrating a method of fabricating a semiconductor device having the plan of FIG. 1A, FIGS. 3B, 4B, 5B, 6B, 7B, 8B, and 9B are cross-sectional views sequentially illustrating a method of fabricating a semiconductor device having the cross-section of FIG. 1B, FIGS. 3C, 4C, 5C, 6C, 7C, 8C, and 9C are cross-sectional views sequentially illustrating a method of fabricating a semiconductor device having the cross-section of FIG. 1C, FIG. 8D is a cross-sectional view taken along line III-III' of FIG. 8A, and FIG. 8E is a view illustrating another example of a cross-sectional view taken along line III-III' of FIG. 8A.

First, referring to FIGS. 2, 3A, 3B, and 3C, a gate insulating layer 210 and a first conductive layer 220 are sequentially stacked on a substrate 100 in S100. The gate insulating layer 210 may be deposited and/or may be grown. The first conductive layer 220 may be formed through an atomic layer deposition (ALD) process and/or a chemical vapor deposition (CVD) process and/or a physical vapor deposition (PVD) process. The gate insulating layer 210 and the first conductive layer 220 may have the same width and may or may not have different thicknesses.

Afterwards, referring to FIGS. 2, 4A, 4B, and 4C, a first mask (not shown), such as a first hardmask and/or a first soft mask, may be disposed on the first conductive layer 220. In this case, the gate insulating layer 210, the first conductive layer 200, and the substrate 100 are etched using the first mask as an etching mask to form the first trenches 110. The first trenches 110 may extend in a first direction D1 and may be spaced apart from each other in a second direction D2 crossing the first direction D1. When the gate insulating layer 210, the first conductive layer 220, and a portion of the substrate 100 are etched to form the first trenches 110, a gate insulating pattern 210' and a first conductive pattern 220' may be formed between adjacent first trenches 110 in S200.

Subsequently, first device isolation layers 120 are formed in the first trenches 110 in S300. An insulating layer may be deposited on the entire surface of the substrate 100 to fill the first trenches 110, and a front surface etch-back (e.g. a blanket etch) process may be performed, to expose an upper surface of the substrate and to form the first device isolation layer 120 in the trenches 110. In this case, sidewalls of each of the gate insulating layer 210 and the first conductive layer 220 may be exposed.

Then, referring to FIGS. 2, 5A, 5B, and 5C, a second conductive layer 230 and a capping layer 240 are sequentially stacked on the first conductive pattern 220' in S400. The second conductive layer 230 and the capping layer 240 may extend in the second direction D2. The second conductive layer 230 and the capping layer 240 may be deposited with an ALD process and/or a CVD process and/or a PVD process; example embodiments are not limited thereto. In this case, the conductive layer 230 and the capping layer 240 may have the same width as each other, and the gate insulating layer 210 and the first conductive layer 220 may also have the same width.

Referring to FIGS. 2, 6A, 6B, and 6C, portions of the second conductive layer 230 and the capping layer 240 are etched using the second mask M2 as an etch mask to form a second conductive pattern 230' and a capping pattern 240' partially covering an upper surface of the first conductive pattern 210' in S500. The second conductive pattern 230' and the capping pattern 240' may extend in the second direction D2.

Afterwards, referring to FIGS. 2, 7A, 7B, and 7C, a portion of each of the first conductive pattern 220' and the gate insulating pattern 210' which is not covered by the second conductive pattern 230' and the capping pattern 240' is etched using M2 as an etching mask.

Accordingly, the gate pattern 200 formed of the capping pattern 240', the second conductive pattern 220', the first conductive pattern 220', and the gate insulating pattern 240' may be formed in S600.

Subsequently, referring to FIGS. 2 and 8A to 8E, a protective layer PL is formed on the substrate 100. In this case, the protective layer PL may have a linear/line shape extending in the first direction D1. A plurality of protective layers PL may be provided and may be spaced apart from each other in the second direction D2. The capping pattern 240', the second conductive pattern 230', the first conductive pattern 220', the gate insulating pattern 210', and the substrate 100 are partially etched (e.g. not fully etched) using the protective layer PL as an etch mask to form second trenches 111 extending in the first direction D1 in S700. In this case, as the portion of the substrate 100 where the gate pattern 200 is present is relatively less etched, the second trench 111 may be formed such that a bottom surface thereof has a concavo-convex structure as shown in FIG. 8D. For example, the bottom surface of the trench 111 may be formed to have a second depth d2 and a third depth d3 depending on a position from an upper end 200_U of the gate pattern 200. Alternatively or additionally, in an etching process, the first device isolation layer 120 may not be completely etched but may remain, as shown in FIG. 8E. In the etching process, the protective layer PL may protect the gate patterns 200 in the second direction D2. After the second trench 111 is formed, the protective layer PL is removed. In this case, the third depth d3 may be a depth from the upper end 200_U of the gate pattern 200 to the first device isolation layer 120 remaining on the substrate 100.

Then, referring to FIGS. 2, 9A, 9B, and 9C, a spacer layer 400 is conformally deposited, e.g. deposited with a CVD process, on the entire surface of the substrate 100 to cover the gate patterns 200 and to fill the second trench 111.

Figure 9A:
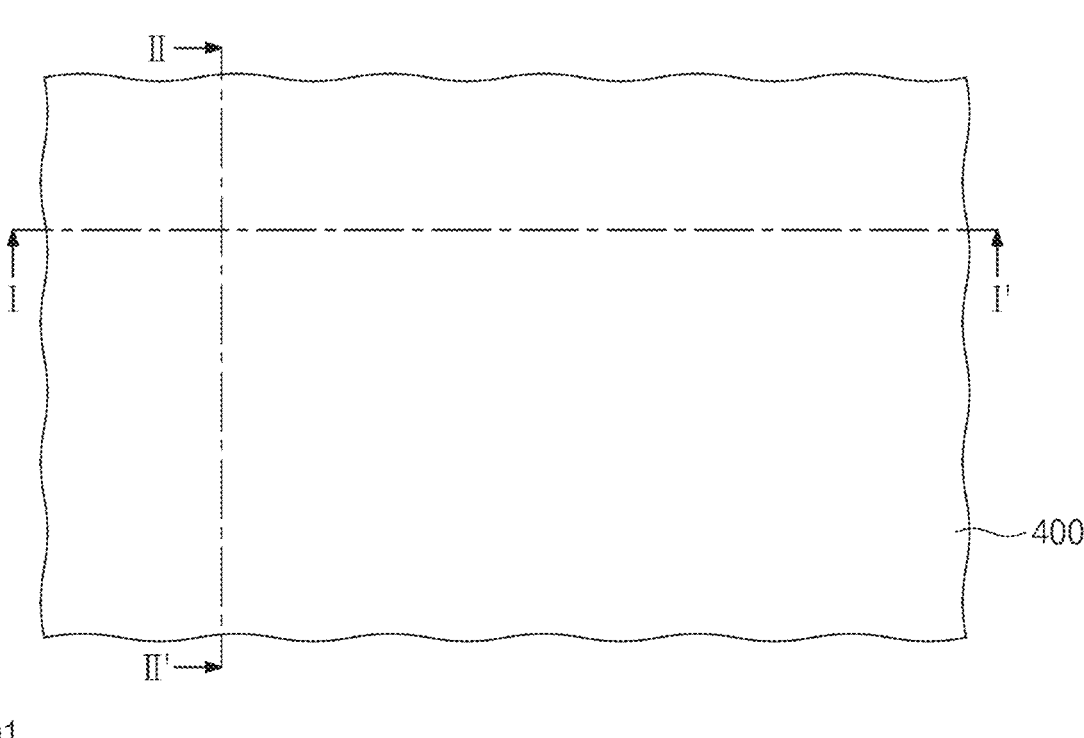
Figure 9B:
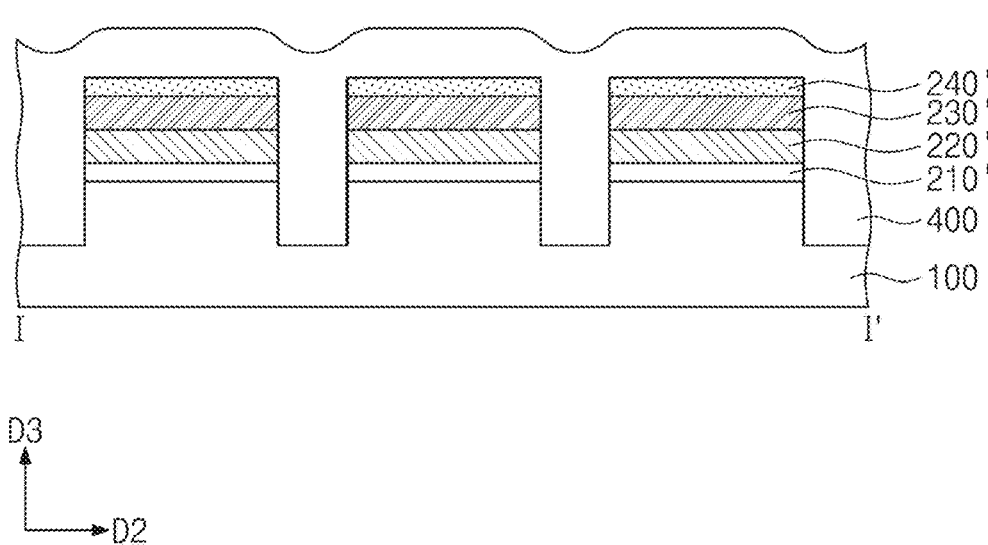
Figure 9C:
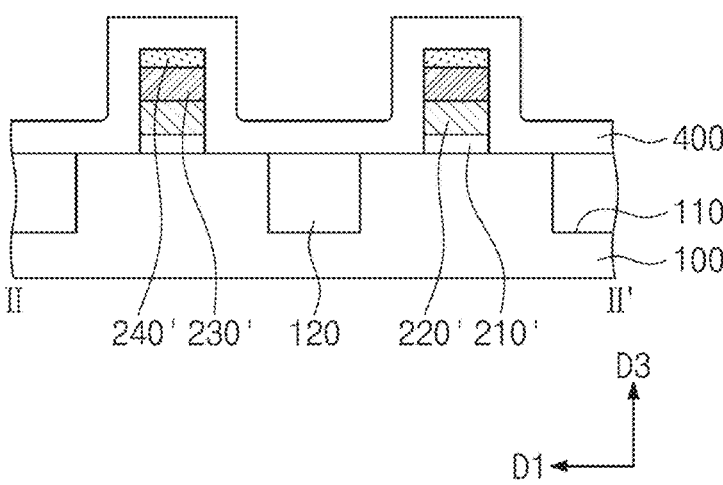

As shown in FIG. 9C, an anisotropic etching process may be performed on the spacer layer 400. The anisotropic etching process may be performed in a dry manner, e.g. with a reactive ion etching (RIE) process; however, example embodiments are not limited thereto.

Accordingly, referring to FIGS. 2, 1A, 1B, and 1C again, through the anisotropic etching process, an upper surface of the gate pattern 200 may be exposed, and a spacer 400$s$ covering sidewalls of the gate pattern 200 and a second device isolation layer 400$f$ filling the second trench 111 may be formed in S800.

Referring to FIG. 1C, ions, such as high-concentration ions such as one or more of boron, carbon, phosphorus, or arsenic may implanted or injected into lower regions of both sides of the gate pattern 200 in the substrate 100 through an ion implantation process to form source/drain regions SD, e.g. to form a lightly doped or heavily doped source/drain regions.

According to various example embodiments, a side surface of a trench of an isolation layer may have a structure aligned with or flush with a side surface of a gate pattern. Accordingly, a gap between gate patterns may be narrowed and/or signal interference between transistors may be prevented/minimized or reduced in likelihood of occurrence, and therefore, electrical characteristics of the transistor may be improved. Alternatively or additionally, a highly integrated semiconductor device may be provided.

While various example embodiments are described above, a person of ordinary skill in the art may understand that many modifications and variations are made without departing from the spirit and scope of the inventive concept defined in the following claims. Accordingly, example embodiments of inventive concepts should be considered in all respects as illustrative and not restrictive, with the spirit and scope of the inventive concept being indicated by the appended claims. Furthermore example embodiments are not necessarily mutually exclusive with one another. For example, some example embodiments may include one or more features described with reference to one or more figures, and may also include one or more other features described with reference to one or more other figures.

What is claimed is:

1. A semiconductor device comprising:

a substrate including a plurality of protrusions protruding from an upper surface thereof and arranged two-dimensionally in a first direction and a second direction intersecting each other, the substrate defining a first trench between the plurality of protrusions in the first direction, and defining a second trench between the plurality of protrusions in the second direction;

a first device isolation layer filling the first trench;

gate patterns on the plurality of protrusions in the second direction, upper surfaces of the plurality of protrusions exposed at both sides of the gate patterns, respectively; and a second device isolation layer filling the second trench and a space between the gate patterns in the second direction, wherein each of the gate patterns has a first sidewall adjacent to the second trench and aligned with an inner wall of the second trench, and wherein a topmost surface of the gate patterns is flush with the second device isolation layer.

2. The semiconductor device of claim 1, wherein a depth of a bottom surface of the first trench from an upper end of the first device isolation layer is different from a depth of a bottom surface of the second trench.

3. The semiconductor device of claim 1, wherein the gate patterns have second sidewalls spaced apart in the first direction, and the semiconductor device further comprises a spacer covering the second sidewalls of the gate patterns, wherein the spacer has a same material as a material of the second device isolation layer.

4. The semiconductor device of claim 3, wherein the spacer extends in the second direction and is connected to the second device isolation layer without an interface between the spacer and the second device isolation layer.

5. The semiconductor device of claim 3, wherein an upper end of the spacer is at a same level as an upper end of the second device isolation layer, and a lower end of the spacer is at a level higher than a level of a lower end of the second device isolation layer.

6. The semiconductor device of claim 3, wherein the spacer has a first width in the first direction, the second device isolation layer has a second width greater than the first width in the second direction, and the second width is smaller than twice the first width.

7. The semiconductor device of claim 1, wherein the second device isolation layer extends in the first direction, and a lower surface of the second device isolation layer has a concavo-convex structure.

8. The semiconductor device of claim 7, wherein the first device isolation layer includes at least two first device isolation layers, and the second device isolation layer includes:

a first portion between the plurality of protrusions;

a second portion between the gate patterns; and a third portion between the at least two first device isolation layers, and wherein a level of a lower surface of the second portion is higher than levels of the first portion and the third portion.

9. The semiconductor device of claim 8, wherein the levels of the first portion and the third portion are same as each other.

10. The semiconductor device of claim 1, further comprising:

source/drain regions within the plurality of protrusions on both sides of the gate patterns.

11. A semiconductor device comprising:

a substrate including a plurality of protrusions protruding from an upper surface thereof and arranged two-dimensionally in a first direction and a second direction intersecting each other, the substrate defining a first trench provided between the plurality of protrusions in the first direction, and the substrate defining a second trench provided between the plurality of protrusions in the second direction;

a first device isolation layer filling the first trench;

gate patterns on the plurality of protrusions in the second direction, upper surfaces of the plurality of protrusions exposed at both sides of the gate patterns, respectively, each of the gate patterns being adjacent to the second trench and having a first sidewall aligned with an inner wall of the second trench, and the gate patterns including second sidewalls spaced apart in the first direction;

source/drain regions within the plurality of protrusions on both sides of the gate patterns;

a second device isolation layer filling the second trench and a space between the gate patterns in the second direction; and a spacer covering the second sidewalls of the gate patterns, wherein the spacer has a same material as a material of the second device isolation layer, and wherein the spacer is connected to the second device isolation layer without an interface between the spacer and the second device isolation layer.

12. The semiconductor device of claim 11, wherein a depth of a bottom surface of the first trench from an upper end of the first device isolation layer is different from a depth of a bottom surface of the second trench.

13. The semiconductor device of claim 11, wherein an upper end of the spacer is at a same level as an upper end of the second device isolation layer, and a lower end of the spacer is positioned at a level higher than a level of a lower end of the second device isolation layer.

14. The semiconductor device of claim 11, wherein the spacer has a first width in the first direction, the second device isolation layer has a second width greater than the first width in the second direction, and the second width is smaller than twice the first width.

15. The semiconductor device of claim 11, wherein the second device isolation layer extends in the first direction, and a lower surface of the second device isolation layer has a concavo-convex structure.

16. The semiconductor device of claim 11, wherein the first device isolation layer includes at least two first device isolation layers, and second device isolation layer includes:

a first portion between the plurality of protrusions;

a second portion between the gate patterns; and a third portion between the at least two first device isolation layers, and wherein a level of a lower surface of the second portion is higher than levels of the first portion and the third portion.

17. The semiconductor device of claim 16, wherein the levels of the first portion and the third portion are same as each other.

18. A semiconductor device comprising:

a substrate including a plurality of protrusions protruding from an upper surface thereof and arranged two-dimensionally in a first direction and a second direction intersecting each other, the substrate defining a first trench provided between the plurality of protrusions in the first direction, and the substrate defining a second trench provided between the plurality of protrusions in the second direction;

a first device isolation layer filling the first trench;

gate patterns on the plurality of protrusions in the second direction, upper surfaces of the plurality of protrusions exposed at both sides of the gate patterns, respectively, and each of the gate patterns being adjacent to the second trench and having a first sidewall aligned with an inner wall of the second trench;

source/drain regions within the plurality of protrusions on both sides of the gate patterns; and a second device isolation layer filling a space between the gate patterns in the second direction and the second trench, wherein a depth of a bottom surface of the first trench from an upper end of the first device isolation layer is different from a depth of a bottom surface of the second trench.

19. The semiconductor device of claim 18, wherein the gate patterns have second sidewalls spaced apart in the first direction, and the semiconductor device further comprises a spacer covering the second sidewalls of the gate patterns, wherein the spacer has a same material as a material of the second device isolation layer, and the spacer is connected to the second device isolation layer without an interface between the spacer and the second device isolation layer.

20. The semiconductor device of claim 18, wherein the first device isolation layer includes at least two first device isolation layers, and the second device isolation layer includes:

a first portion between the plurality of protrusions;

a second portion between the gate patterns; and a third portion between the at least two first device isolation layers, and wherein a level of a lower surface of the second portion is higher than levels of the first portion and the third portion.

* * * * *